United States Patent
Katsuyama et al.

(10) Patent No.: US 6,560,119 B1
(45) Date of Patent: May 6, 2003

(54) FASTENING PARTS SUITABLE FOR RECYCLING

(75) Inventors: Koji Katsuyama, Yokohama (JP); Mitsuo Tanikado, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/195,701

(22) Filed: Nov. 19, 1998

(30) Foreign Application Priority Data

Jun. 23, 1998 (JP) .......................................... 10-176317

(51) Int. Cl.[7] .............................. H05K 5/00; H05K 5/04; H05K 5/06
(52) U.S. Cl. .................... 361/752; 361/742; 361/807; 439/76.1; 174/138 D; 174/138 G
(58) Field of Search ................................ 361/752, 753, 361/742, 807, 808, 767, 770; 174/138 D, 138 G; 439/76.1; 411/32, 180–182, 15, 23; 156/73.1

(56) References Cited

U.S. PATENT DOCUMENTS

| | | | | |
|---|---|---|---|---|
| 3,403,718 A | * | 10/1968 | Hughes | 411/180 |
| 4,521,148 A | * | 6/1985 | Tanaka | 411/15 |
| 4,546,408 A | * | 10/1985 | Rodseth et al. | 361/715 |
| 4,726,722 A | * | 2/1988 | Wollar | 411/32 |
| 4,832,551 A | * | 5/1989 | Wollar | 411/280 |
| 4,842,437 A | * | 6/1989 | Egner | 403/24 |
| 4,906,152 A | * | 3/1990 | Kurihara | 411/182 |
| 5,500,789 A | * | 3/1996 | Miller et al. | 361/816 |
| 5,519,169 A | * | 5/1996 | Garrett et al. | 174/35 R |
| 5,697,744 A | * | 12/1997 | Medal | 156/73.1 |
| 5,879,115 A | * | 3/1999 | Medal | 156/272.2 |

FOREIGN PATENT DOCUMENTS

| | | | |
|---|---|---|---|
| JP | 407098008 A | * | 4/1995 |
| JP | 407099395 A | * | 4/1995 |

\* cited by examiner

Primary Examiner—Albert W. Paladini
Assistant Examiner—Tuan Dinh
(74) Attorney, Agent, or Firm—Armstrong, Westerman & Hattori, LLP

(57) ABSTRACT

Fastening parts suitable for recycling are disclosed. The fastening parts include a plastic main body with at least two engaging projections, and metal inserts having interior screw threads contained integrally inside the plastic main body. Designing electronic equipment using such fastening parts enable easy parts separation from the plastic main body at disassembly, and facilitate recycling of both fastening parts and the plastic main body.

12 Claims, 6 Drawing Sheets

FASTENING PARTS SUITABLE FOR RECYCLING

BACKGROUND OF THE INVENTION

FIELD OF THE INVENTION

The present invention relates to fastening parts suitable for recycling, and fixing structures of electronic equipment that use these parts. Throughout the world, concerns are growing regarding the destruction of the environment on a global scale. With the amount of waste increasing each passing year, efforts are underway to recycle waste as well as to reduce the amount of waste being generated. These efforts are also being undertaken with such electronic equipment as information processing devices. To ensure that resources are used more effectively, the complete or partial recycling of such devices is already being attempted.

The service life of electronic equipment is based on the durability of the product (measured in expected years of use) and the frequency with which the product is used. Although a given device may be nearing the end of its service life, many of its components may still have many years of use left in them. These components need to be targeted for reuse or recycling. More specifically, electronic equipment, such as personal computers and printers, contain numerous plastic and metal parts. These parts are considered appropriate recycling targets.

Electronic parts, like printed circuit boards, are generally fixed to mold-formed plastic housings. First, a metal insert with a threaded hole (screw seat) is inserted into the cavity of a boss on the housing for integration as one unit. Then the electronic part is mounted on the boss and the screw is tightened in the screw seat of the metal insert.

In a prior art, a metal insert with the screw seat is formed simultaneously as one unit with the plastic housing during a plastic forming operation. According to another method, after the plastic housing is molded, the metal insert is set into the boss by applying pressure with supersonic waves.

Another type of assembly setup makes use of the characteristics of springs. With this assembly setup, after the molding process, the metal insert is snapped in position on the boss so that the boss covers the insert. For all assembly setup types, however, the metal insert is fixed to the boss of the plastic housing. It is therefore difficult to separate or remove the metal insert from the plastic housing.

See FIG. 1 for an example of a conventional structure. FIG. 1 shows a metal insert 6 with a screw seat (threaded hole) molded as one unit in the boss of a plastic housing 2. Also, an annular groove 8 is formed beforehand in the circumference of the boss 4 to facilitate the removal of the metal insert 6.

For disassembly, dedicated tools are used to bend and remove the boss 4 (with metal insert 6) from the housing 2. This bending and removing process tends to weaken the fastening part, and creates difficulties in identifying the metal insert 6. As a result, the process becomes time consuming and laborious.

For recycling plastics, it is necessary to design products that can be easily disassembled for recycling. The plastic housing of electronic equipment should be designed without the use of metal inserts. Note that from the point of view of certain functions, however, the use of metal inserts is unavoidable.

Electronic equipment is usually disassembled at the end of its service life. In recycling the plastic and disassembled parts of electronic equipment, many steps are required to separate and remove the metal inserts in conventional structures. This complicates the recycling process.

SUMMARY OF THE INVENTION

What is required to resolve these problems includes structures that are easily disassembled and separated (i.e., structures from which metal inserts are easily separated and removed). Thus, one of the objectives of the present invention is to offer fastening parts with metal inserts suitable for recycling.

Another objective of the present invention is to offer a fixing structure for electronic equipment suitable for recycling. The fastening parts with metal inserts are easily separated and removed from plastic housings.

The present invention provides fastening parts suitable for recycling, characterized by a plastic main body with at least two engaging projections for connection with a cooperating member, such as a housing for electronic equipment, or the like, and metal inserts with an interior screw thread integrally inserted in the plastic main body. The plastic main body preferably possesses a conical or pyramid-trapezoidal shape. Otherwise, the plastic main body may be composed of a square-shaped lower part and a cylindrical upper part. The plastic main body can be formed of ABS resin or polypropylene, for example.

The present invention additionally provides a fixing structure for electronic equipment characterized by a plastic housing suitable for recycling with a boss formed with through-holes, a plastic main body having at least two engaging projections inserted in the through-holes of the boss, a fastening part composed of metal inserts with interior screws integrally inserted in the main body, an electronic part having a through-hole mounted on the boss, and a screw passing said through-hole mounted and engaged in the fastening part.

By providing the fastening part with a conical or pyramid-trapezoidal shape, tightening the screw firmly causes the fastening part to come into firm contact with the interior surface of the boss in order to prevent relative rotation between the fastening part and the boss.

The boss which receives the fastening part is formed with multiple grooves for holding the engaging projections. When the fastening part is inserted into a through-hole of the boss, each engaging projection on the fastening part engages a cooperating groove of the boss, thereby allowing the fastening part to be temporarily fixed inside the boss.

When the fastening part is composed of a square-shaped lower part and a cylindrical upper part, the through-hole of the boss should be stepped to accommodate the shape of the fastening part.

In use, loosening the screw in damaged electronic equipment separates the fastening part from the housing whereby the fastening part can be reused. The fastening part, which has a metal insert, can be easily separated from the plastic housing. Thus, if the housing is melted and then formed again, the plastic can be recycled and reused.

DESCRIPTION OF A PREFERRED EMBODIMENT OF THE INVENTION

Figure 1:
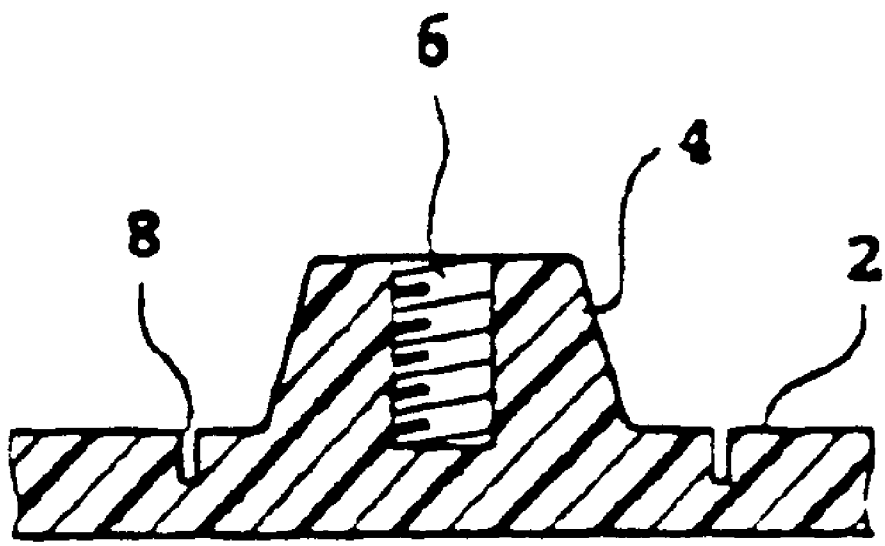
FIG. 1 is a cross-sectional view of a fastening part according to the prior art.
Figure 2:
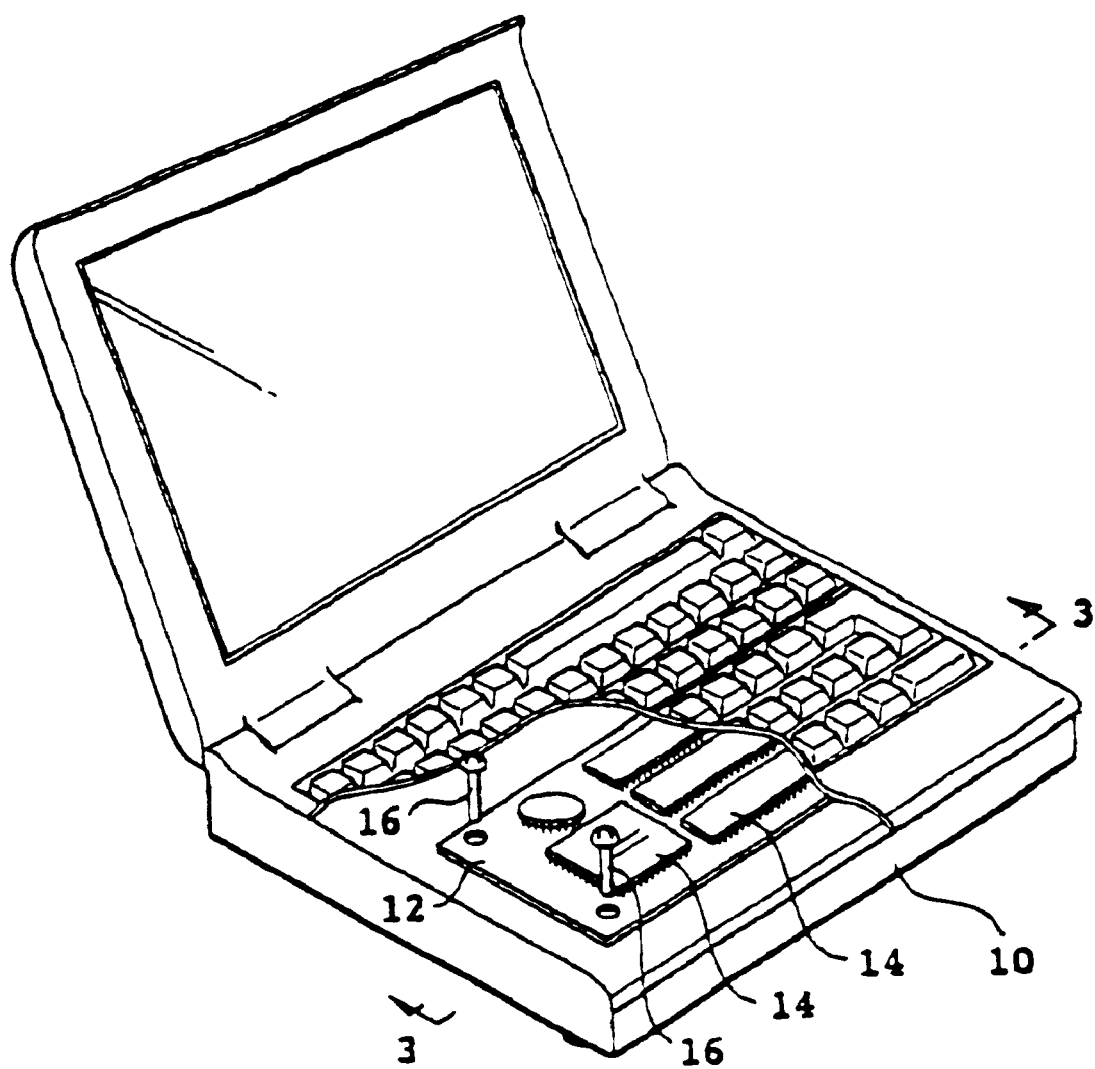
FIG. 2 is an isometric view partly in section of a notebook personal computer suitable for use of the present invention.

FIG. 2 shows an isometric view, partly in section, of a notebook personal computer using the fastening structure of the present invention. Plastic housing 10 houses printed circuit board 12 on which multiple electronic parts 14 (e.g., LSI) are mounted. Printed circuit board 12 is secured to plastic housing 10 by multiple screws 16.

Figure 3:
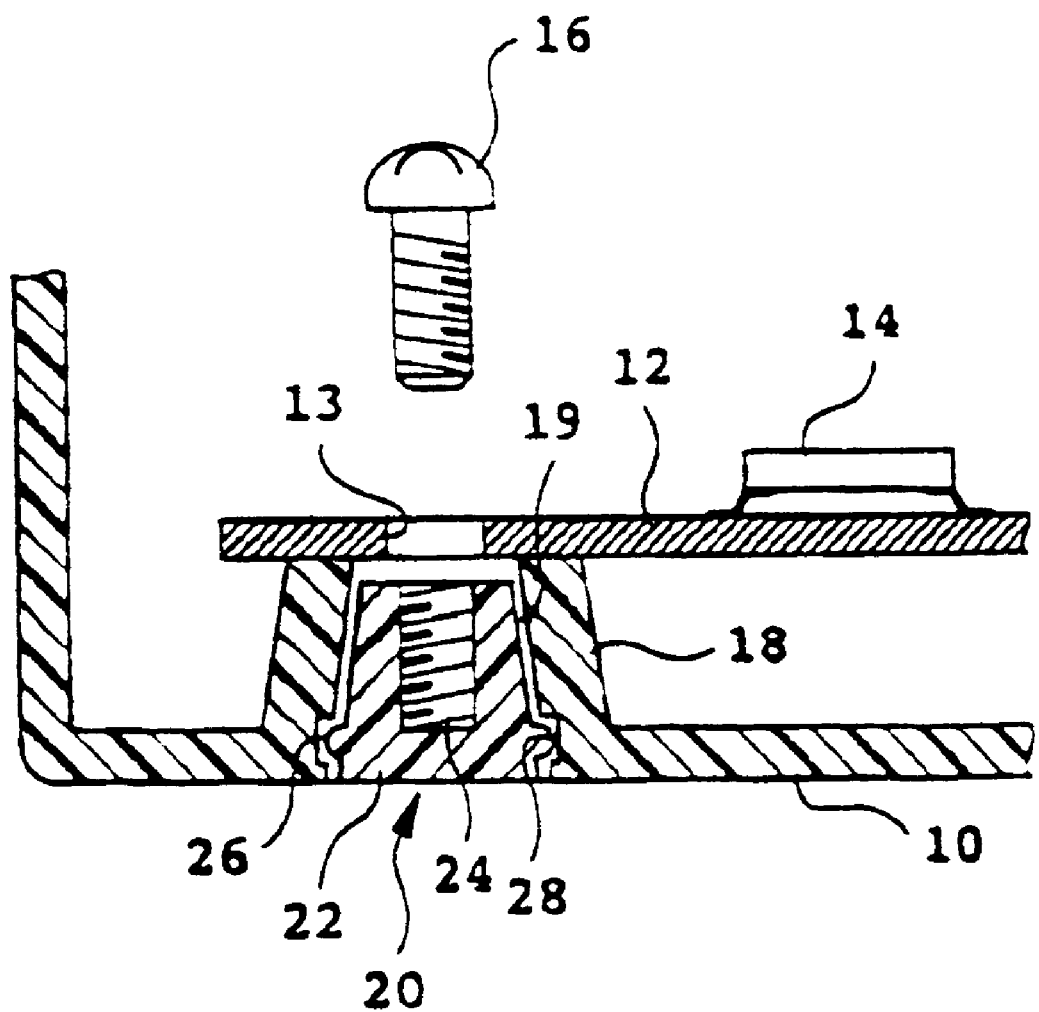
FIG. 3 is a cross-sectional view taken along line 3—3 of FIG. 2.

FIG. 3 shows a cross-sectional view taken along line 3—3 of FIG. 2 and illustrates a plastic housing 10 having a boss 18 formed as one unit and containing a through-hole 19.

Reference numeral 20 generally designates a fastening part composed of a plastic main body 22 and a metal insert 24 integrally inserted inside the plastic main body 22.

Metal insert 24 is a pre-formed member which is installed in the plastic main body 22 when mold-forming the main body. Alternatively, the preformed metal insert can be pressed under pressure into a hole formed in the main body 22 after the main body 22 has been formed.

The plastic main body 22 of the fastening part 20 is preferably formed of ABS resin or polypropylene. For the metal insert 24, commercially available brass is preferably used.

Figure 4A:
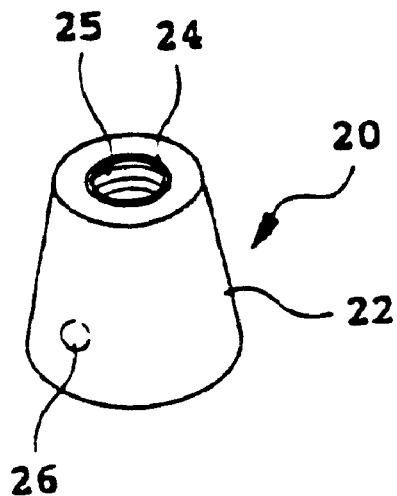
FIG. 4 shows various embodiments of the invention with FIG. 4A showing an isometric view of the fastening part according to one embodiment of the invention and FIG. 4B showing an isometric view of the fastening part of another embodiment of the invention.

The plastic main body 22, as shown in FIG. 4A, has a conical trapezoidal shape. Metal insert 24 has a screw seat 25 containing interior screw threads. Plastic main body 22 possesses two semi-spherical projections 26 extending from opposite sides of the body.

As shown in FIG. 3, through-hole 19 in the boss 18 is shaped to accommodate the external shape of the fastening part 20. Grooves 28 are provided on opposite sides of the surface of through-hole 19 and are configured to receive the respective projections 26 for retaining and properly aligning the fastening part 20 in the boss.

Thus, when the fastening part 20 is inserted in the boss 18 of housing 10, projections 26 on the fastening part 20 are fitted the respective grooves 28, and the fastening part 20 is fixed temporarily in the boss 18. Screw 16 engages with the interior screw threads of the metal insert 24 via through-hole 13 in the printed circuit board 12, so that the printed circuit board 12 is secured to the housing 10.

The fastening part 20 secured in the boss 18 of FIG. 3 has a conical-trapezoidal shape. Thus, when screw 16 is tightened fastening part 20 is drawn firmly into contact against the interior face of the boss 18 so that the fastening part 20 cannot rotate.

When the notebook personal computing system is dissembled, multiple screws 16 are unfastened and removed. Fastening parts 20 are easily separated from the respective bosses 18 and can be used again. Thus, if the housing 10 is melted and then formed again, the fastening part 20 can be reused.

A fastening part 20 typically has a compact size of not more than 2 cm. in diameter and 2 cm. in height so that it can be pushed out by using a small screwdriver or a finger.

Fastening parts 20 should have a color different from that of the housing 10 so the fastening parts can be easily recognized when dissembling. It is possible to change the colors of fastening parts 20 depending on material quality (e.g., ABS resin is red, polypropylene is yellow) so as to simplify selection after separation and disassembly. Selection can be made even more accurate by using abbreviations for material quality on the fastening part 20.

Figure 4B:
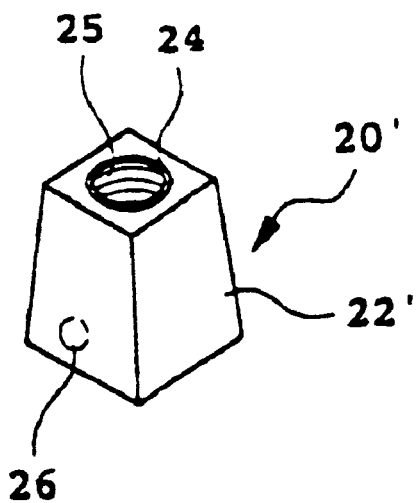

FIG. 4B shows an isometric view of another embodiment of a fastening part 20' having a pyramid-trapezoid shape. By means of this shape, rotation of the fastening part when tightening a screw can be more certainly prevented.

Figure 5:
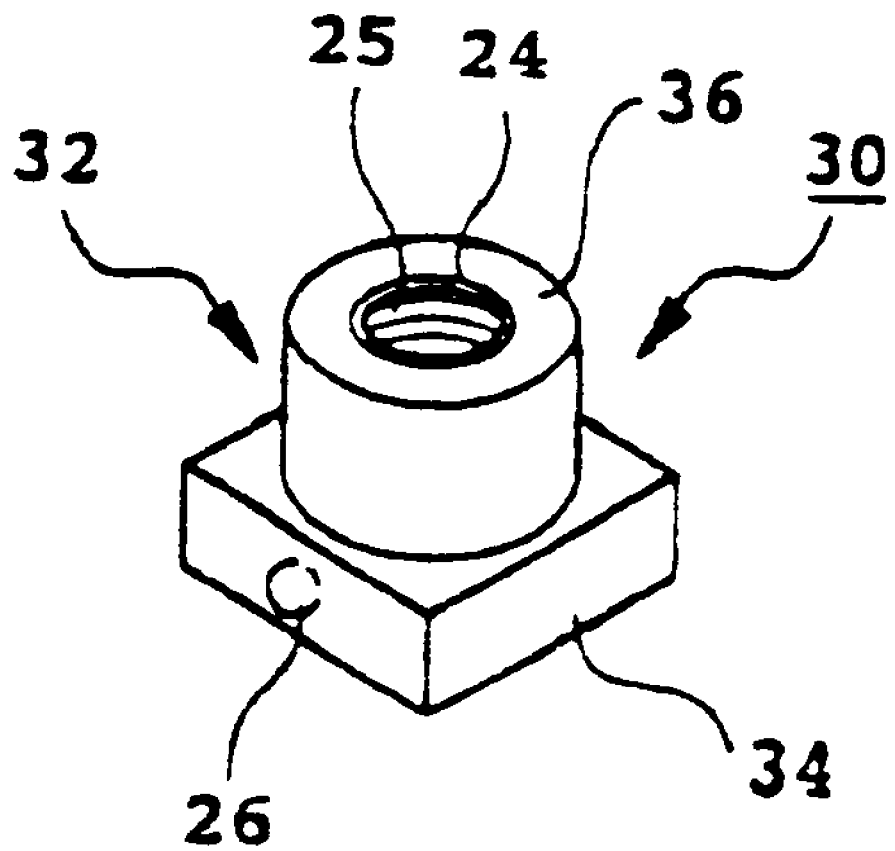
FIG. 5 is an isometric view of a fastening part according to a further embodiment of the invention.

FIG. 5 shows an isometric view of yet another embodiment of a fastening part 30 having a stepped configuration. As shown, the plastic main body 32 of the fastening part 30 is composed of a square-shaped lower part 34 and a cylindrical upper part 36. Metal insert 24 is integrally inserted in the cylindrical upper part 36 and square-shaped lower part 34 is formed with a pair of semi-spherical projections 26 (only one being shown). Through-holes 19 of bosses 18 in the housings 10 employing this form of fastening part are formed to accommodate the stepped shaped of the fastening part 30.

Figure 6A:
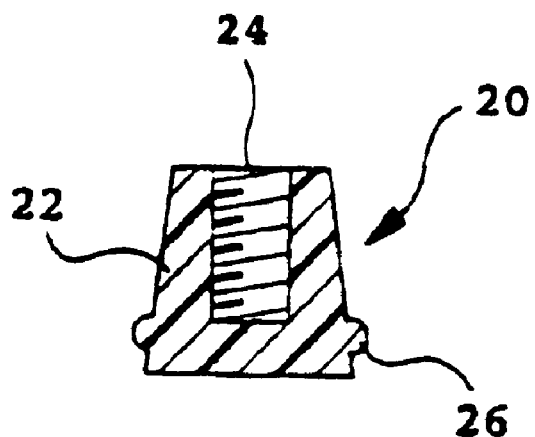
FIGS. 6A and 6B are cross-sectional views of alternate forms of fastening parts with projections of different shapes.
Figure 6B:
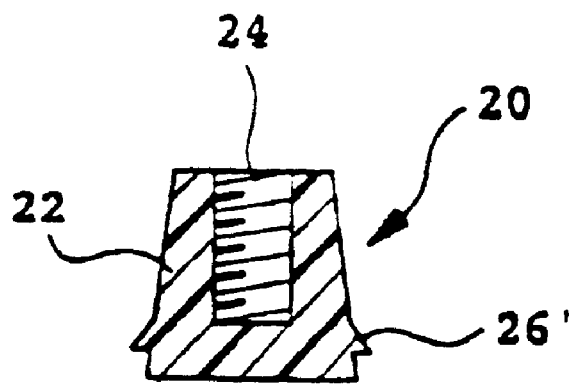

FIG. 6A and FIG. 6B show respective cross-sectional views of fastening parts 20. As shown in FIG. 6A, plastic main body 22 is formed with a pair of semi-spherical projections 26, and as a modified example, a pair of hook-shaped projections 26', as shown in FIG. 6B, can also be used.

Projections 26 or 26' are not limited to two. There may be three or more whereupon the boss 18 of the housing 10 will be formed with grooves corresponding to the particular projections 26, 26'.

The present invention comprises a fastening part and a plastic main body formed with metal inserts inside. Thus, according to the present invention, the fastening part can be easily separated from the plastic housing, and a fastening part suitable for recycling is provided. Designing electronic equipment using these fastening parts can, therefore, provide parts suitable for recycling.

What is claimed:

1. A fastening part suitable for recycling and being intended for detachable connection with a cooperating member containing an opening having connection grooves for reception of said fastening part, said fastening part comprising:

a plastic main body containing an opening;

a metal insert having an internally threaded portion of constant diameter received in said opening of said plastic main body, said plastic main body fixedly securing said metal insert in said opening; and said plastic main body further containing an exterior surface having integrally formed engaging portions projecting therefrom for detachable engagement in the connection grooves of said cooperating member.

2. The fastening part according to claim 1 in which said plastic main body is formed as a conical frustrum.

3. The fastening part according to claim 1 in which said plastic main body is formed as a frustrum of a pyramid.

4. The fastening part according to claim 1 in which said plastic main body contains a square shaped lower portion and a cylindrical upper portion formed integrally with said lower portion, said upper portion of said plastic main body containing said metal inert, and said lower portion of said plastic main body containing said integrally formed engaging projections.

5. Electronic equipment having a plastic housing and a fixing structure for securing elements to said housing, said fixing structure comprising:
- a boss formed on said housing,
- a through-hole extending axially through said boss, and groove means provided in an internal surface of said boss;
- a fastening part adapted to be detachably connected to said boss, said fastening part having a plastic main body inserted in the through-hole of said boss, said plastic main body containing an opening, an internally threaded metal insert being fixedly secured in said opening in said plastic main body and being open to an end of said plastic main body, said plastic main body having an external surface containing integrally formed engaging projections extending therefrom, said engaging projections being operative to engage said groove means in said boss for detachably securing said fastening part to said boss;
- an element for mounting electronic parts mounted on said boss, said element having a through-opening aligned with said metal insert in said plastic main body; and
- a screw extending through said through-opening of said element for threaded connection with internal threads in said metal insert of said fastening part.

6. The fixing structure according to claim 5 in which said groove means includes a plurality of grooves disposed at spaced locations about the periphery of said internal surface of said boss, and a corresponding number of integrally formed engaging projections on the exterior of said plastic main body of said fastening part, each engaging a respective one of said grooves.

7. The fixing structure according to claim 5 in which said plastic main body of said fastening part is formed as a conical frustrum and said through-hole in said boss contains a complimentary shape for reception of said plastic main body of said fastening part.

8. The fixing structure according to claim 5 in which said plastic main body of said fastening part is formed as a frustrum of a pyramid and said through-hole in said boss contains a complimentary shape for reception of said plastic main body of said fastening part.

9. The fixing structure according to claim 5 in which said plastic main body of said fastening part has a square shaped lower portion and a cylindrical upper portion formed integrally with said lower portion, and said through-hole in said boss contains a complimentary shape for reception of said plastic main body of said fastening part.

10. The fixing structure according to claim 5 in which said element containing electronic parts is a circuit board.

11. The fixing structure according to claim 5 in which said fastening part has a color different from that of said plastic housing.

12. The fixing structure according to claim 9 in which said square-shaped lower portion of said plastic main body contains said integrally formed engaging projections disposed at spaced locations about the periphery of said lower portion, and said through-opening in said boss contains a corresponding number of grooves for reception of said engaging projections.

* * * * *